United States Patent [19]

Strasser

[11] 4,184,623
[45] Jan. 22, 1980

[54] PROCESS FOR BONDING CIRCUIT MODULES ONTO A THIN-FILM CIRCUIT

[76] Inventor: Burkhard Strasser, Liechtensteinerstrasse 13, 6800 Feldkirch, Austria, 4

[21] Appl. No.: 831,424

[22] Filed: Sep. 8, 1977

[30] Foreign Application Priority Data

Sep. 9, 1976 [DE] Fed. Rep. of Germany ....... 2640613

[51] Int. Cl.$^2$ .............................................. B29K 31/02
[52] U.S. Cl. .......................... 228/180 A; 219/85 BM; 228/212
[58] Field of Search ............. 228/6 A, 44.1 A, 180 A, 228/106, 212; 219/85 BA, 85 BM, 85 F; 269/266

[56] References Cited

U.S. PATENT DOCUMENTS

| 2,399,824 | 5/1946 | Pressman | 269/266 X |
| 3,588,425 | 6/1971 | Erickson | 219/85 BA |
| 3,717,743 | 2/1973 | Costello | 219/85 BM |
| 3,791,018 | 2/1974 | Johnston et al. | 228/180 A |
| 3,838,984 | 10/1974 | Crane et al. | 228/180 A X |
| 3,905,537 | 9/1975 | Schmehl | 228/44.1 A |

Primary Examiner—Francis S. Husar
Assistant Examiner—K. J. Ramsey
Attorney, Agent, or Firm—Schuyler, Birch, McKie & Beckett

[57] ABSTRACT

A circuit module is mounted on a flexible substrate, forming what is usually referred to as a micropack. This substrate has soldered conducting paths that are provided with solder spots at the sites where they shall be bonded with the conducting paths of a thin-film hybrid circuit. the micropack is inserted onto the hybrid circuit with a pair of vacuum forceps or tweezers, and adjusted and pressed into the conducting paths of the hybrid circuit under the action of the pins of a pressure plate or clamp. At the same time, the conducting paths of the micropack are bonded with the conducting paths of the hybrid circuit through infrared irradiation.

1 Claim, 2 Drawing Figures

PROCESS FOR BONDING CIRCUIT MODULES ONTO A THIN-FILM CIRCUIT

BACKGROUND OF THE INVENTION

The invention relates to a process for bonding a flexible substrate having conducting paths—with which is connected a circuit module mounted thereon—with conducting paths of a film circuit mounted on a ceramic substrate, one side of the flexible substrate having soldered conducting paths as well as solder spots.

Semiconductor systems mounted on sheets forming what is usually referred to as micropack housings have found increasingly wide application as hybrid modules for hybrid-integrated film circuits. These micropack housings are provided on one side with soldered conducting paths having solder spots at accurately determined locations. They have preferably been employed in film circuits, with the solder spots of the soldered side of a micropack being bonded with specified conducting paths of the thin-film circuit. However, because the solder spots are generally not of equal thickness, not all of them make contact with the conducting path pattern of the film circuit, so that correct soldering into this type of circuit is impossible.

It is an object of this invention to bond semiconductor systems mounted on sheets (so-called micropacks) with soldered as well as with unsoldered conducting paths of a film circuit.

SUMMARY OF THE INVENTION

The above and other objects of the invention are achieved in that the ceramic substrate—at the site where the circuit module mounted on the flexible substrate shall be inserted—is provided with a bonding agent, that subsequently the circuit module mounted on the substrate is inserted at this site into the film circuit and adjusted to the correct position, that the bonding agent is then hardened, whereupon part of the film circuit is heated during a brief period at least in the region of the solder spots, the solder spots of the flexible substrate being bonded electrically with the conducting paths of the substrate under the action of a force applied to the flexible substrate by the pins of a pressure plate or clamp.

The advantage of this process lies in the fact that within certain bounds and whatever the heights of the solder spots, the above-described circuit module mounted on a sheet can be soldered into a film circuit with a high degree of reliability, since the solder spots can be pressed with uniform pressure on to the conducting paths of the film circuit. This process may be employed with soldered as well as with unsoldered conducting paths of the thin-film circuit. In the case of soldered conducting paths, the varying distances to the solder spots are compensated with a high degree of reliability by the uniform force application of the flexible substrate against the ceramic substrate. However, in many cases it is impossible to solder in advance the conducting paths of the thin-film circuit, e.g., when fabricating conducting path crossovers by means of electrodeposited gold bridges. Although the wetting characteristic of unsoldered conducting paths usually consisting of gold is worse than that of soldered conducting paths, a dependable soldering of circuit modules is also achieved in this case by the process described hereinabove.

In many cases, it is convenient to use as a bonding agent electrically and/or thermally conducting epoxy resin. In this way, in addition to the purpose of the bonding agent to permanently and mechanically connect the micropack with the substrate, a further advantage is achieved in that, due to the electrical conductivity of the bonding agent, an electrically conducting connection between the chip and the substrate can be obtained. Moreover, the heat generated in the circuit module can easily be dissipated.

Due to its small size, the micropack can advantageously be inserted with a pair of vacuum forceps or tweezers.

The adjustment of position can best be effected with a micro-manipulator by means of which the micropack can be accurately positioned in a horizontal direction.

To prevent unnecessary heating of the film circuit, which may previously be fitted with other components—this could sometimes result in a change of the electrical properties and in a loosening of the bonds—it is advisable to heat only the site into which the micropack shall be soldered. This is best accomplished by placing the film circuit on a preheating plate having a slot through which a heating device acts upon the back of the ceramic substrate.

The pressure plate or clamp mentioned in the introduction may advantageously be formed by a device having a cavity and a pressure chamber which is in communication with a multiplicity of pins.

To apply a uniform force to the pins or the conducting paths, the cavity may advantageously be filled with air or with other gases under pressure so as to impart a certain springiness to the punches.

BRIEF DESCRIPTION OF THE DRAWING

The process and the apparatus according to the invention will be described with reference to the accompanying two figures, wherein.

DETAILED DESCRIPTION OF THE PREFERRED EMBODIMENT

Figure 1:
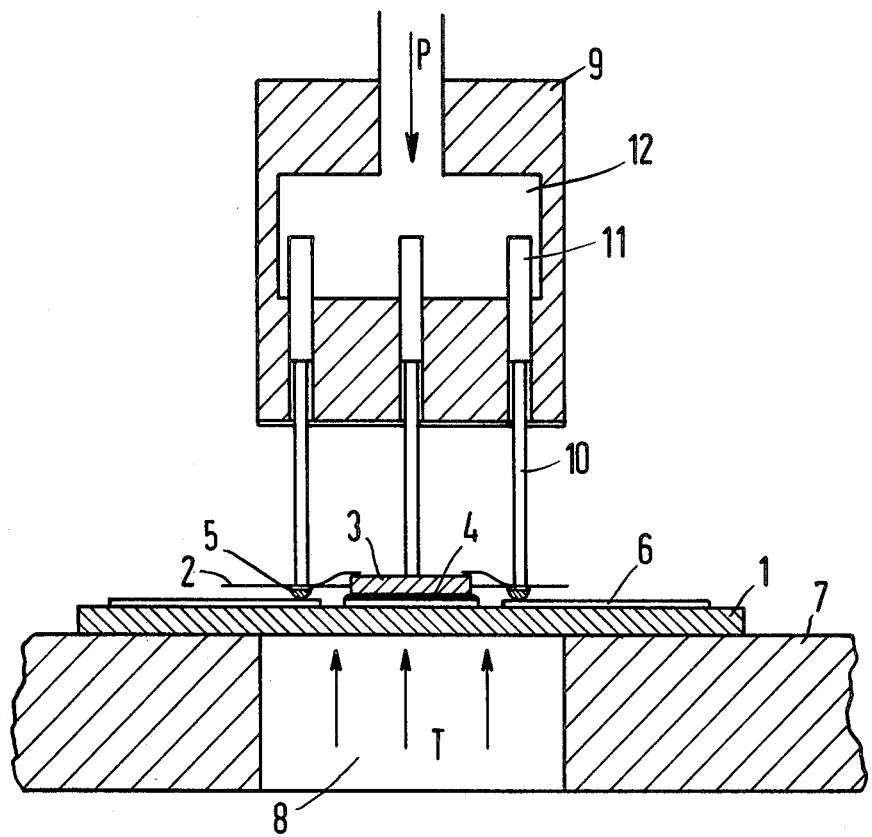
FIG. 1 is a sectional view of a device for bonding a solid-state circuit mounted on a flexible substrate with the conducting paths of a thin-film hybrid circuit.

A micropack formed of a flexible plastic substrate 2 carrying a solid-state circuit 3 is mounted on a thin-film hybrid circuit having a ceramic substrate 1 on which is carried a conducting path pattern 6. A bonding agent 4 in the form of an electrically conducting epoxy resin is placed where the solid-state circuit 3 is to be bonded onto the back of the hybrid circuit. The flexible substrate 2 carrying the solid-state circuit 3 is inserted with a micromanipulator (not shown) at this predetermined site of the thin-film hybrid circuit, with the solid-state circuit 3 being held with a pair of vacuum forceps or tweezers. At the same time, the micropack is adjusted such that the mounting of the solder spots on the bottom of the flexible substrate 2 corresponds with the provided conducting-path termination pattern 6 of the hybrid circuit.

The bonding site is then cured, giving rise to a mechanically stable, electrically and thermally highly conducting connection between the micropack and the substrate 1 of the thin-film hybrid circuit. The thusly fitted thin-film hybrid circuit 1 is then placed on a preheating plate 7 in the middle of which there is a slot 8 through which the heating medium T necessary for soldering is transmitted to the substrate by means of a gas flame or infrared rays. Above this slot there is disposed a pressure plate or hold downclamp 9 which moves in a vertical direction. With the aid of a manipulator that allows a horizontal movement in all directions, the thin-film hybrid circuit mounted on the preheating plate is brought to the position provided for soldering, that is to say, the part to be soldered mounted on the circuit is adjusted above slot 8 of plate or clamp 7 and underneath pressure plate 9.

The pressure plate 9 is then lowered, its pins 10 pressing the flexible substrate 2 against the conducting path terminations of the hybrid circuit, with the solder spots 5 situated on its bottom. At the same time, part of the substrate 1 of the hybrid circuit is heated on the bottom during a brief period by means of infrared rays or a gas flame until the temperature required for soldering is attained. After the proper formation of the solder joints, the pressure plate 9 is raised again, thereby ending the hybridizing process.

Figure 2:
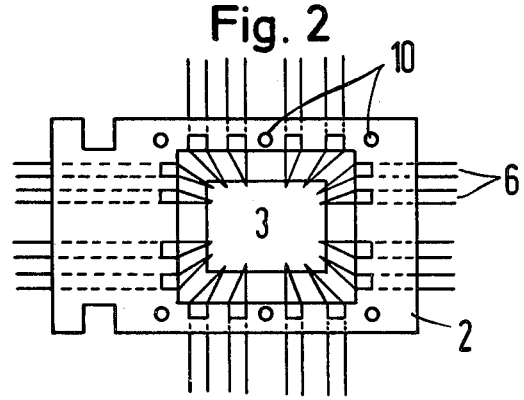
FIG. 2 is a top view of the solid-state circuit.

The purpose of the pins 10 of the pressure plate 9 is to press the plastic subcarrier uniformly against the conducting path terminations of the hybrid circuit. As a result, all solder spots make contact with the conducting path terminations during the soldering process. As shown in FIG. 2, the six pins 10 are disposed above the plastic subcarrier. They are constructed in their guides as pistons 11. The guides terminate in a common chamber 12 in which there is fluid under pressure P. The pressure P and, hence, the contact force of the pins, can be set accurately by means of a dosage valve (not shown).

I claim:

1. A method of bonding a flexible substrate having a circuit element disposed thereon and connected to conductive strips, with conductive strips of a film circuit disposed on a ceramic substrate, one side of said flexible substrate having soldered conductive strips as well as solder blisters, characterized in providing said ceramic substrate (1) with an adhesive agent (4) at the site where said circuit element (3) disposed on said flexible substrate (2) is to be inserted, inserting said circuit element (3) located on said substrate (2) into said film circuit and adjusting it at the site provided with said adhesive agent, then curing said adhesive agent and selectively heating said film circuit for a short time at least in the area of said solder blisters, while exerting bonding forces on said flexible substrate by a plurality of pins (10) of a hold down clamp (9) having a pressure chamber operable to force the pins against the substrate, the solder blisters of said substrate (2) thereby being bonded electrically with the conductive strips (6) of said ceramic substrate under the influence of the force exerted on said flexible substrate (2) by said pins, said heating step being carried out by one of infrared radiation and a gas flame directed upon the reverse side of said ceramic substrate through a hole in a support for said reverse side.

* * * * *